United States Patent
Wada et al.

(10) Patent No.: US 6,998,881 B2
(45) Date of Patent: *Feb. 14, 2006

(54) SEMICONDUCTOR INTEGRATED CIRCUIT DEVICE

(75) Inventors: Shinichiro Wada, Fuchu (JP); Satoshi Ueno, Ome (JP); Shinya Kajiyama, Tachikawa (JP)

(73) Assignee: Hitachi, Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/948,304

(22) Filed: Sep. 24, 2004

(65) Prior Publication Data

US 2005/0040869 A1    Feb. 24, 2005

Related U.S. Application Data

(63) Continuation of application No. 10/411,122, filed on Apr. 11, 2003, now Pat. No. 6,809,562.

(30) Foreign Application Priority Data

May 31, 2002   (JP)   .............................. 2002-159288

(51) Int. Cl.
*H03B 19/00*   (2006.01)
(52) U.S. Cl. ..................................... 327/113; 327/114
(58) Field of Classification Search ................ 327/113, 327/114, 144, 145; 326/63, 64, 69, 73, 74, 326/77, 109, 110
See application file for complete search history.

(56) References Cited

U.S. PATENT DOCUMENTS

| | | | |
|---|---|---|---|
| 5,412,262 A | 5/1995 | Nishio et al. | 326/64 |
| 5,850,155 A | 12/1998 | Matsumoto | 326/109 |
| 6,104,219 A | 8/2000 | Barkatullah et al. | 327/116 |
| 6,385,273 B1 | 5/2002 | Hsu et al. | 377/19 |

FOREIGN PATENT DOCUMENTS

JP    6-237160    8/1994

*Primary Examiner*—Tuan T. Lam
(74) *Attorney, Agent, or Firm*—Miles & Stockbridge P.C.

(57) ABSTRACT

In a circuit for converting an input signal Data1 of high frequency to an output signal Data4 of low frequency, a signal of the frequency band (for example, 10 GHz to 2.5 GHz) which can be processed only with a bipolar ECL circuit is processed with a bipolar ECL circuit. After the frequency of signal up to the maximum frequency which can be processed with a CMOS circuit is lowered, the signal is inputted to the CMOS circuit via a level conversion circuit in order to lower the frequency (for example, 2.5 GHz to 1.25 GHz). Thereby, power consumption of the semiconductor integrated circuit device, particularly the device including the Bi-CMOS circuit can be lowered while highseed processing characteristic in the signal process of the circuit is maintained.

18 Claims, 19 Drawing Sheets

1:2 DEMUX CIRCUIT

2:1 MUX CIRCUIT

SEMICONDUCTOR INTEGRATED CIRCUIT DEVICE

CROSS-REFERENCE TO RELATED APPLICATION

This application is a continuation of Application Ser. No. 10/411,122 filed Apr. 11, 2003 now U.S. Pat. No. 6,809,562.

BACKGROUND OF THE INVENTION

The present invention relates to a technique of semiconductor integrated circuit (device) and particularly to the technique which may be effectively applied to the semiconductor integrated circuit device including a bipolar device and a MISFET (Metal Insulator Semiconductor Field Effect Transistor) formed on one chip.

The semiconductor integrated circuit device is formed of various circuits and introduces a so-called Bi-CMOS circuit combining a bipolar transistor which assures high-speed operation property and a complementary MISFET which assures low power consumption.

Particularly, development of communication technology requires a semiconductor integrated circuit which ensures high-speed operation rate for wider frequency range.

For example, a CDR (Clocked Data Recovery) circuit for processing a high-speed signal is described in the ISSCC 2000 Digest of Technical Papers (Feb. 7, 2000) p. 57. As illustrated in FIG. 3.4.1 of this reference, a signal is outputted by synchronizing a high-speed input signal (Data input) with the clock signal generated by a VOC (Voltage-controlled Oscillator) circuit.

Moreover, the Japanese Unexamined Patent Publication No. Hei 6(1994)-237160 discloses the technique related to a multiplexer using Bi-CMOS, a logical gate, and an adder.

SUMMARY OF THE INVENTION

The inventors of the present invention have continued research and development of semiconductor integrated circuit device for processing a high-speed signal and particularly for IC (Integrated Circuit) for optical communication.

For example, an IC for optical communication in 10 Gbps (b/s) utilizes a bipolar ECL (Emitter-Coupled Logic) introducing a bipolar transistor for high-speed process of 10 Gbps signal.

However, this bipolar ECL circuit consumes a large amount of electrical power. Moreover, since scale of circuit becomes large as functions of IC are further sophisticated, power consumption of chip reaches the order of several watts.

As a result, such power consumption is a factor of rise in manufacturing cost because a type of package is restricted in order to assure good heat radiation characteristic of IC.

Accordingly, in view of attaining low power consumption, it is proposed that a MISFET is also used to process a low frequency signal with a complementary MISFET circuit.

For example, a PD (Phase Detector) circuit, a selector circuit, a VCO circuit and a DIV/64 circuit in the CDR circuit of ISSCC 2000 are respectively formed of bipolar circuit (BIPOLAR) to process a high-speed signal. Meanwhile, a PFD (Phase Frequency Detector) circuit and a Lock Detector circuit for processing the signal after the signal is frequency-divided to 1/64 with the DIV/64 are respectively formed of CMOS of low power consumption.

However, even in this CDR circuit, since a circuit formed of CMOS is limited only to the circuit provided after the signal is frequency-divided to 1/64 in the DIV/64, the effect of low power consumption is also restricted.

Therefore, an object of the present invention is to realize low power consumption of a semiconductor integrated circuit device, particularly of a device including a Bi-CMOS circuit.

Moreover, it is also an object of the present invention to improve the characteristics thereof such as improvement in the processing rate of the same device.

The aforementioned and the other objects and novel features of the present invention will become apparent from the description of this specification and the accompanying drawings thereof.

The typical profiles disclosed by the present invention will be briefly described as follows.

(1) The semiconductor integrated circuit device of the present invention is a semiconductor integrated circuit device comprising a bipolar device and a MISFET device, further including (a) a first circuit formed of a bipolar device, the first circuit receiving a first signal of a first frequency and outputting a second signal of a second frequency which is lower than the first frequency, (b) a level conversion circuit for converting level and amplitude of signal, the level conversion circuit receiving the second signal and outputting a third signal of the second frequency responding to the second signal, and (c) a second circuit comprised of a MISFET device, the second circuit receiving the third signal and outputting a fourth signal of a third frequency which is lower than the second frequency.

(2) The semiconductor integrated circuit device of the present invention is a semiconductor integrated circuit device comprising a bipolar device and a MISFET device further including (a) a first circuit comprised of a MISFET device, the first circuit receiving a first signal of a first frequency and outputting a second signal of a second frequency which is higher than the first frequency, (b) a level conversion circuit for converting level and amplitude of signal, the level conversion circuit receiving the second signal and outputting a third signal of the second frequency responding to the second signal, and (c) a second circuit comprised of a bipolar device, the second circuit receiving the third signal and outputting a fourth signal of the third frequency which is higher than the second frequency.

DETAILED DESCRIPTION OF THE PREFERRED EMBODIMENTS

Embodiment 1

Figure 1:
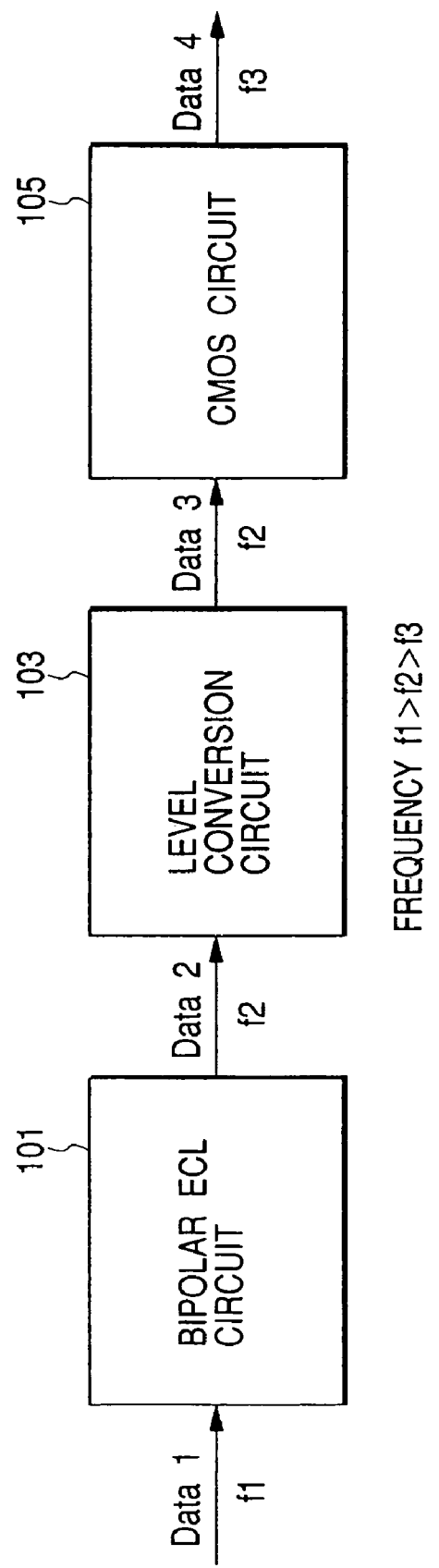
FIG. 1 is a block diagram illustrating a semiconductor integrated circuit (device) as a first embodiment of the present invention.

A first embodiment of the present invention will be described with reference to the accompanying drawings. The elements having the like functions are designated with the like reference numerals throughout the drawings and the same description is avoided.

Figure 2:
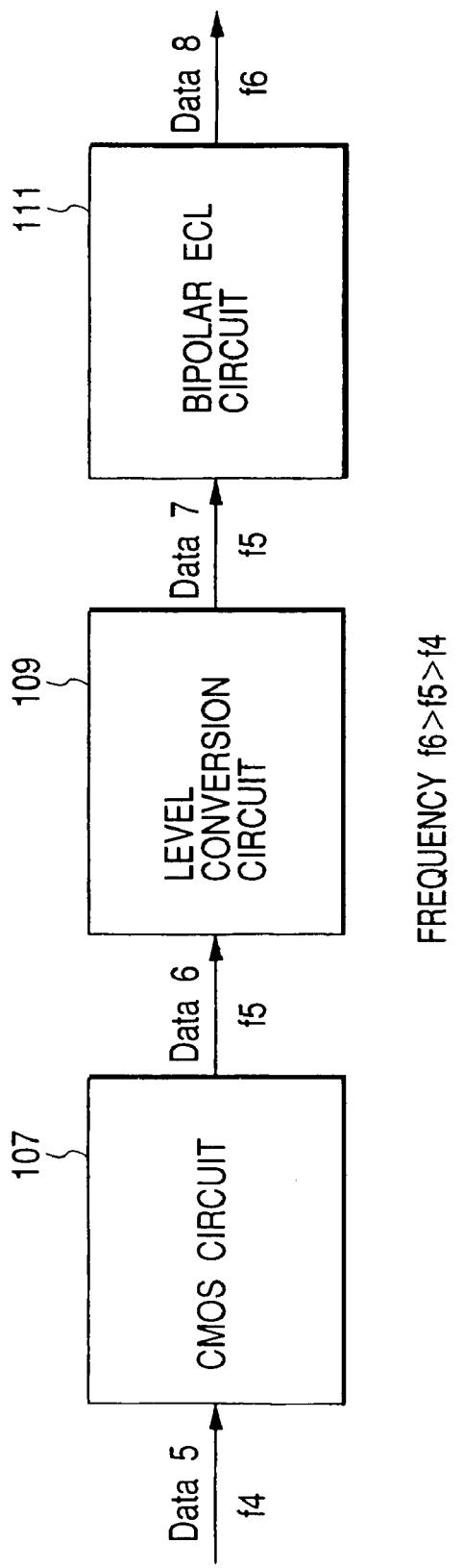
FIG. 2 is a block diagram illustrating a semiconductor integrated circuit (device) as the first embodiment of the present invention.

FIG. 1 and FIG. 2 are block diagrams illustrating a semiconductor integrated circuit (device) as a first embodiment of the present invention. As illustrated in FIG. 1, an input signal Data1 of (1) frequency f1 has, for example, the higher frequency of 10 Gz (f1=10 GHz). This input data Data1 is inputted to a bipolar ECL circuit 101 and is then processed therein. Moreover, the bipolar ECL circuit 101 outputs an output signal Data2 of frequency f2. This frequency f2 is lower than the frequency f1 (f2<f1) and is for example 2.5 GHz. In addition, this frequency f2 is the maximum frequency which may be processed by a complementary MISFET circuit (hereinafter, referred to as "CMOS circuit") in the subsequent stage.

Thereafter, the output signal Data2 becomes an input signal of a level conversion circuit 103 and is then adjusted in its amplitude and level to the degree which may be driven with a CMOS circuit 105. Here, only the amplitude and level of signal are converted but the frequency is maintained. Accordingly, an output data Data3 of frequency f2 can be outputted from the level conversion circuit 103.

Figure 16:
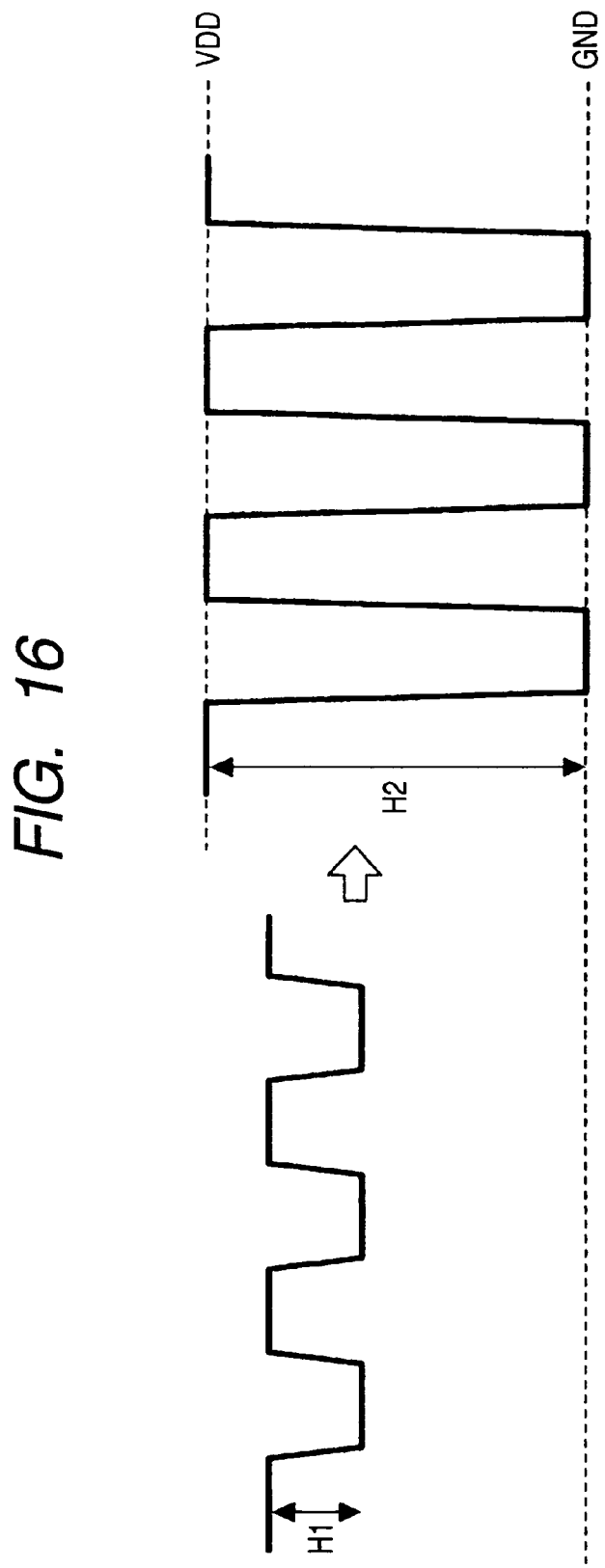
FIG. 16 is a diagram showing a relationship between amplitude and level of an input signal and an output signal of a level conversion circuit.

FIG. 16 illustrates a relationship between amplitude and level of the input signal Data2 and output signal Data3 of the level conversion circuit 103. The input signal has the amplitude H1, while the output signal has the amplitude H2 between the power source potential VDD and the ground potential GND.

Thereafter, the output signal (frequency f2) Data3 is inputted to the CMOS circuit 105 and is then processed therein. This CMOS circuit 105 outputs an output signal Data4 of frequency f3. This frequency f3 is lower than frequency f2 (f3<f2) and is, for example, 1.25 GHz.

As described above, according to this embodiment, in the circuit for converting the input signal Data1 of higher frequency (f1) to the output signal Data4 of low frequency (f3), since a signal of the frequency band (for example, the frequency between 10 GHz and 2.5 GHz) which can be processed only with a bipolar ECL circuit is processed with the bipolar ECL circuit 101 and the frequency of this signal is lowered (for example, 2.5 GHz to 1.25 GHz) after the frequency of signal is lowered to the maximum frequency which can be processed in the CMOS circuit, low power consumption of the circuit may be realized while the high-speed signal processing characteristic is maintained.

That is, when a circuit corresponding to the CMOS circuit 105 is formed, for example, of a bipolar ECL circuit, power consumption increases but according to this embodiment, power consumption may be lowered.

Moreover, in general, since the CMOS circuit may be miniaturized more easily than the bipolar circuit, integration density of circuit can also be improved.

(2) Next, a circuit for converting a low frequency signal to a high frequency signal will then be described.

As illustrated in FIG. 2, an input signal Data5 of frequency f4 has the low frequency, for example, of 1.25 GHz (f4=1.25 GHz). This input signal Data5 is inputted to a CMOS circuit 107 and is processed therein. Moreover, the CMOS circuit 107 outputs an output signal Data6 of frequency f5. This frequency f5 is higher than the frequency f4 (f5>f4) and is, for example, 2.5 GHz. Moreover, this frequency f5 is the maximum frequency which may be processed by the CMOS circuit 107.

Next, the output signal Data6 becomes an input signal of a level conversion circuit 109 and is adjusted in its amplitude and level, to the degree to be driven with a bipolar ECL circuit 111. Here, only the amplitude and level of signal are converted and the frequency is maintained. Therefore, the level conversion circuit 109 outputs an output signal Data7 of frequency f5.

A relationship between the amplitude and level of the input signal Data6 and output signal Data7 of the level conversion circuit 109 is inverted from that described with reference to FIG. 16. That is, the input signal has the amplitude H2 between the power source potential VDD and the ground potential, while the output signal has the amplitude H1.

Next, the output signal (frequency f5) Data7 is then inputted to the bipolar ECL circuit 111 and is then processed therein. The bipolar ECL circuit 111 outputs an output signal Data8 of frequency f6. This frequency f6 is higher than the frequency f5 (f6>f5) and is, for example, 10 GHz.

As described above, according to this embodiment, in the circuit for converting the input signal Data5 of low frequency (f4) to the output signal Data8 of high frequency (f6), since conversion to the maximum frequency (for example, to 2.5 GHz) which may be processed by the CMOS circuit is performed by the CMOS circuit 107 and the signal of the frequency higher than such frequency (for example, between 10 GHz and 2.5 GHz) is processed by the bipolar ECL circuit 111, low power consumption of circuit can be realized while the high-speed signal processing characteristic is maintained.

That is, when the circuit corresponding to the CMOS circuit 107 is formed, for example, of a bipolar ECL circuit, power consumption increases but according to this embodiment, power consumption can be lowered.

Moreover, in general, the CMOS circuit can be miniaturized more easily than the bipolar circuit, integration density of the circuit can be improved.

Embodiment 2

Figure 3:
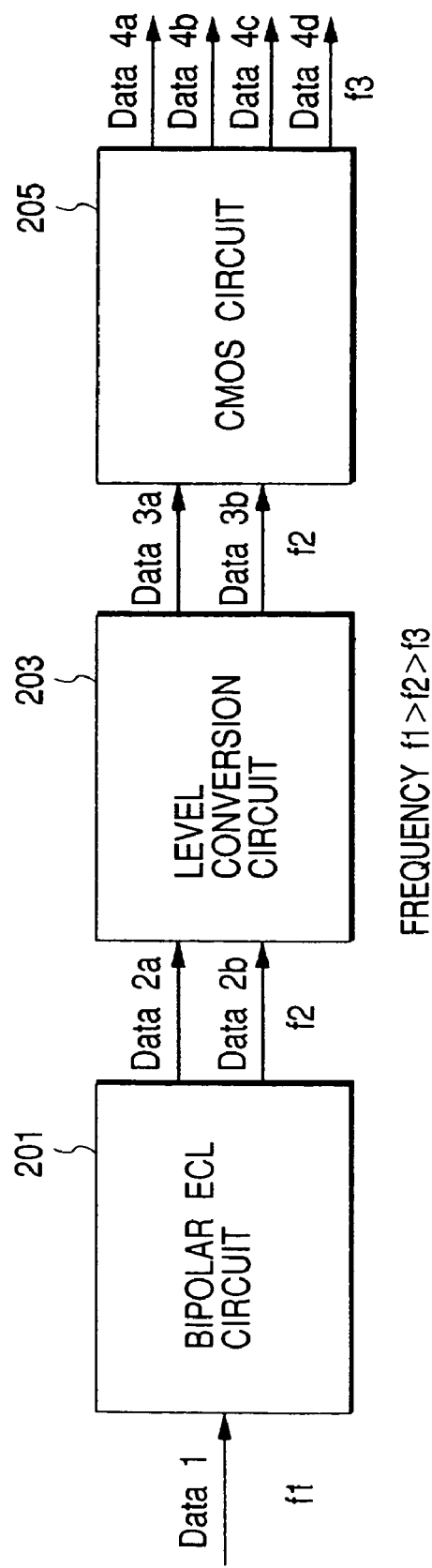
FIG. 3 is a block diagram illustrating a semiconductor integrated circuit (device) as a second embodiment of the present invention.
Figure 4:
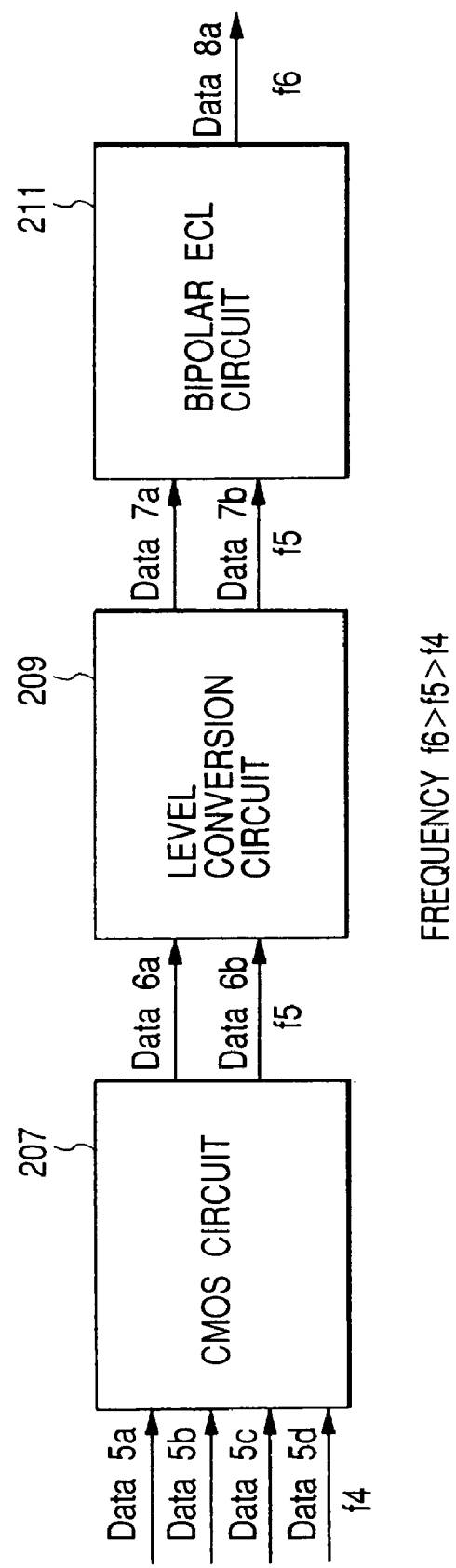
FIG. 4 is a block diagram illustrating a semiconductor integrated circuit (device) as the second embodiment of the present invention.

FIG. 3 and FIG. 4 illustrate block diagrams of a semiconductor integrated circuit device of a second embodiment of the present invention.

(1) FIG. 3 illustrates a circuit (including bipolar ECL circuit and CMOS circuit) described with reference to FIG. 1 in the embodiment 1 having the function of demultiplexer (hereinafter, referred to as "DEMUX").

As illustrated in FIG. 3, the input signal Data1 of frequency f1 is inputted to a bipolar ECL circuit 201 and is then processed therein, but the frequency $2f$ of output signals (Data2a, Data2b) is reduced to $1/2^n$ times the frequency f1 and the number of output data (number of output signals) is increased to $2^n$ times. That is, the bipolar ECL circuit 201 has the DEMUX function to divide the input signal to $2^n$ signals having the frequency of $1/2^n$ times. Here, n is a positive integer. In FIG. 3, n is selected to 1 (n=1).

The output signals Data 21 and Data2b are adjusted in its amplitude and level by a level conversion circuit 203 to the degree which may be driven with a CMOS circuit 205 to become the output signals Data2a and Data3b. In this case, the signal frequency is maintained at f2.

Thereafter, the output signals (frequency f2) Data3a and Data3b are inputted to the CMOS 205 and are then processed therein. As a result, the frequency f3 of the output signals Data4a to Data4d are reduced to $1/2^m$ times the frequency f2. Moreover, the number of output data (the number of output signals) is increased to $2^m$ times. That is, the CMOS circuit 205 has the DEMUX function to divide the input signal to $2^m$ signals having the frequency of $1/2^m$ times. Here, m is a positive integer. In FIG. 3, m is selected to 1 (m=1).

Therefore, the circuit of FIG. 3 has the DEMUX function to divide one input signal to $2^{(n+m)}$ signals having the frequency $1/2^{(n+m)}$ (hereinafter referred to as "$1:2^{(n+m)}$").

In this circuit, the circuit of the subsequent stage is required to process in parallel the $2^n$ input signals and therefore, the scale of circuit (number of elements forming the circuit) becomes large in comparison with the circuit in the preceding stage.

Accordingly, as in the case of this embodiment, when the circuit in the subsequent stage is assumed as the CMOS circuit 205, power consumption can be lowered. Moreover, the region of circuit can also be reduced.

(2) FIG. 4 illustrates a circuit (comprising bipolar ECL circuit and CMOS circuit) described with reference to FIG. 2 of the embodiment 1 having the multiplexer (hereinafter referred to as MUX) function.

As illustrated in FIG. 4, the input signals Data5a to 5d of the frequency f4 are inputted to a CMOS circuit 207 and is then processed therein. The frequency f5 of the output signals (Data6a, Data6b) thereof is increased to $2^m$ times the frequency f4 and the number of output data (number of output signals) is decreased to $1/2^m$ times. That is, the CMOS circuit 207 has the MUX function to multiplex an input signal to the $1/2^m$ signals having the frequency of $2^m$ times. In FIG. 4, m is selected to 1 (m=1).

These output signals Data6a and Data6b are adjusted in the amplitude and level thereof with a level conversion circuit 209 to the degree which can be driven by a bipolar ECL circuit 211 and become the output signals Data7a, Data7b. In this case, the frequency of signal is maintained at f5.

Next, the output signals (frequency f5) Data7a, Data7b are inputted to the bipolar ECL circuit 211 and processed therein. As a result, the frequency f6 of the output signals Data8a, 8b is increased up to $2^n$ times the frequency f5 and the number of outputs (number of output signals) is reduced to $1/2^n$ times. That is, the bipolar ECL circuit 211 has the MUX function to multiplex the input signal to $1/2^n$ signals having the frequency of $2^n$ times. In FIG. 4, n is selected to 1 (n=1).

Therefore, the circuit of FIG. 4 has the MUX function to multiplex an input signal to $1/2^{(n+m)}$ signals in the frequency of $2^{(n+m)}$ (hereinafter referred to as "$2^{(n+m)}:1$").

In this circuit, since the circuit of the preceding stage is required to process in parallel a plurality of input signals, scale of circuit (number of elements forming the circuit) becomes large in comparison with the circuit in the subsequent stage.

Therefore, when the circuit in the preceding stage is assumed as the CMOS circuit 207, power consumption thereof can be reduced. Moreover, circuit region can also be reduced.

Embodiment 3

Figure 5:
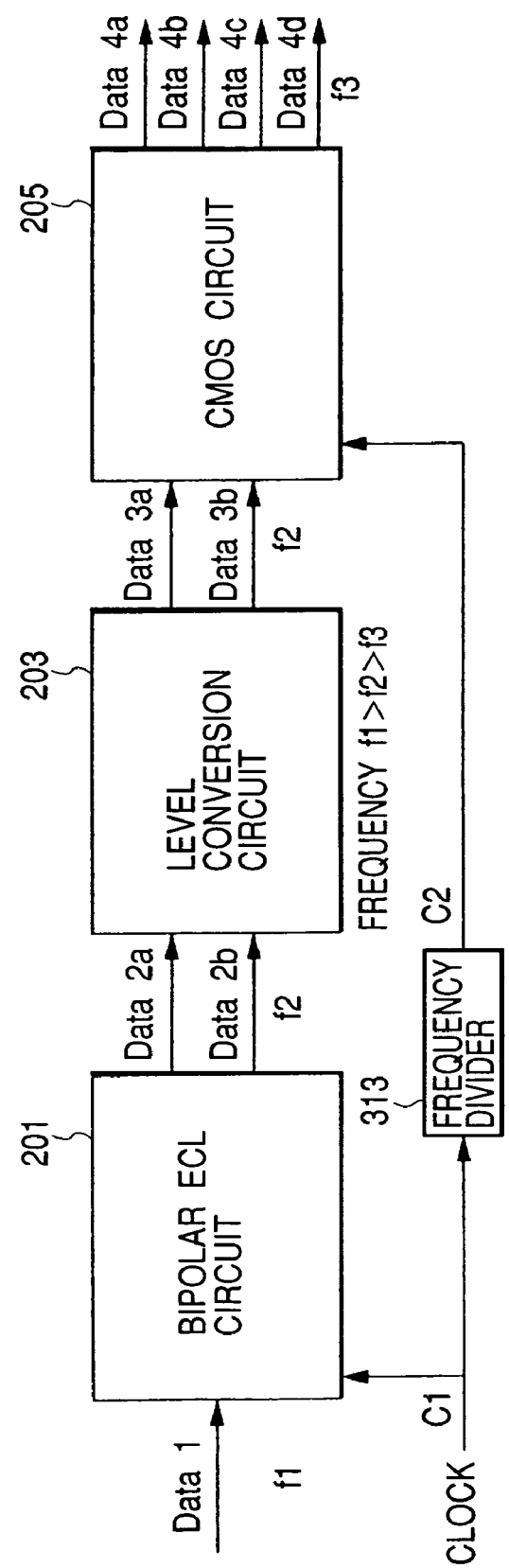
FIG. 5 is a block diagram illustrating a semiconductor integrated circuit (device) as a third embodiment of the present invention.
Figure 6:
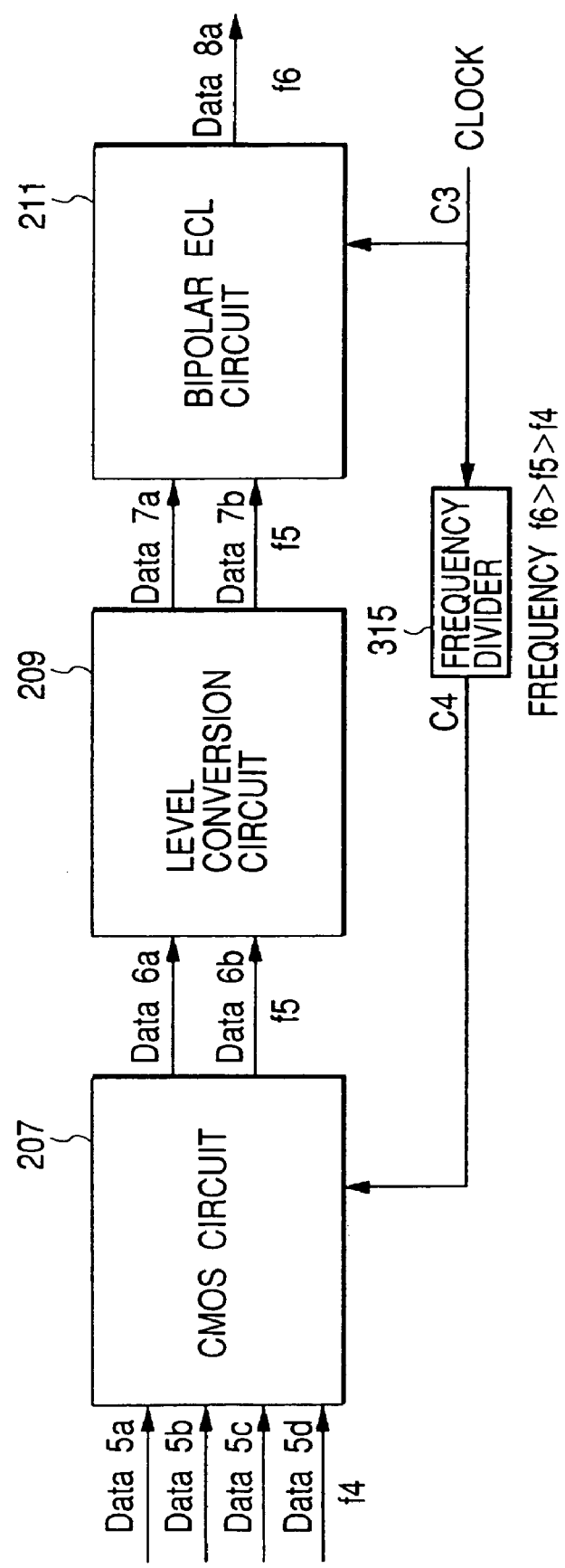
FIG. 6 is a block diagram illustrating a semiconductor integrated circuit (device) as the third embodiment of the present invention.

FIG. 5 and FIG. 6 are block diagrams of a semiconductor integrated circuit device as a third embodiment of the present invention.

(1) In FIG. 5, the circuit described with reference to FIG. 3 of the embodiment 2 (bipolar ECL circuit and CMOS circuit or the like) is controlled with a clock (control signal). The elements like those of FIG. 3 are designated with like reference numerals and the same description is omitted.

As illustrated in FIG. 5, a clock C1 is inputted to the bipolar ECL circuit 201 and the bipolar ECL circuit is controlled to be synchronized with the clock C1. Therefore, this clock C1 is synchronized with the frequency of the output signals Data2a and Data2b of the bipolar ECL circuit 201. That is, when the frequency of the signal inputted to the initial stage of the bipolar ECL circuit 201 is f1 (for example, 10 GHz) and the frequency outputted from the initial stage is f2 (for example, 5 GHz), the clock C1 inputted to the circuit of initial stage is f2 (5 GHz).

Moreover, this clock C1 (frequency f1) is divided by a frequency divider 313 to become a clock C2 of the frequency f3. In other words, the clock C1 is inputted to the frequency divider 313 to output the clock C2. The frequencies f1 and f3 of the clocks are in the relationship of f1=$2^n$×f3.

This frequency divider 313 may also be formed of a bipolar ECL circuit and a CMOS circuit. Therefore, even in this frequency divider, as described with reference to FIG. 1 in the embodiment 1, a high frequency signal is processed (frequency-divided) with the bipolar ECL circuit and the low frequency signal is processed with the CMOS circuit. Thereby, power consumption of circuit can be reduced and high integration density can also be realized.

(2) In FIG. 6, the circuit described with reference to FIG. 4 of the embodiment 2 (bipolar ECL circuit and CMOS circuit or the like) is controlled with a clock (control signal). The elements having like functions as that in FIG. 4 are designated with the like reference numerals and the same description is avoided.

As illustrated in FIG. 6, a clock C4 is inputted to a CMOS circuit 207 and this CMOS 207 is controlled to synchronize with this lock C4. Therefore, this clock C4 is also synchronized with the frequency of the input signals Data5a to Data5d of the CMOS circuit 207. That is, when the frequency of the signal inputted to the CMOS circuit 207 is f4 (for example, 625 MHz), the clock C4 inputted to this circuit is f4 (625 MHz).

Moreover, this clock C4 (frequency f4) is identical to an output from a frequency divider 315 to frequency-divide the clock C3 of frequency f3. In other words, the frequency-divider 315 receives the clock C3 and outputs the clock C4. The frequencies f4 and f5 of clocks are in the relationship of f5=$2^m$×f4.

Like the frequency divider 313, this frequency divider 315 may be formed of a bipolar ECL circuit and a CMOS circuit. Accordingly, low power consumption and high integration density of circuit may be realized by processing (dividing) a high frequency signal with the bipolar ECL circuit and processing a low frequency signal with the CMOS circuit.

Figure 7:
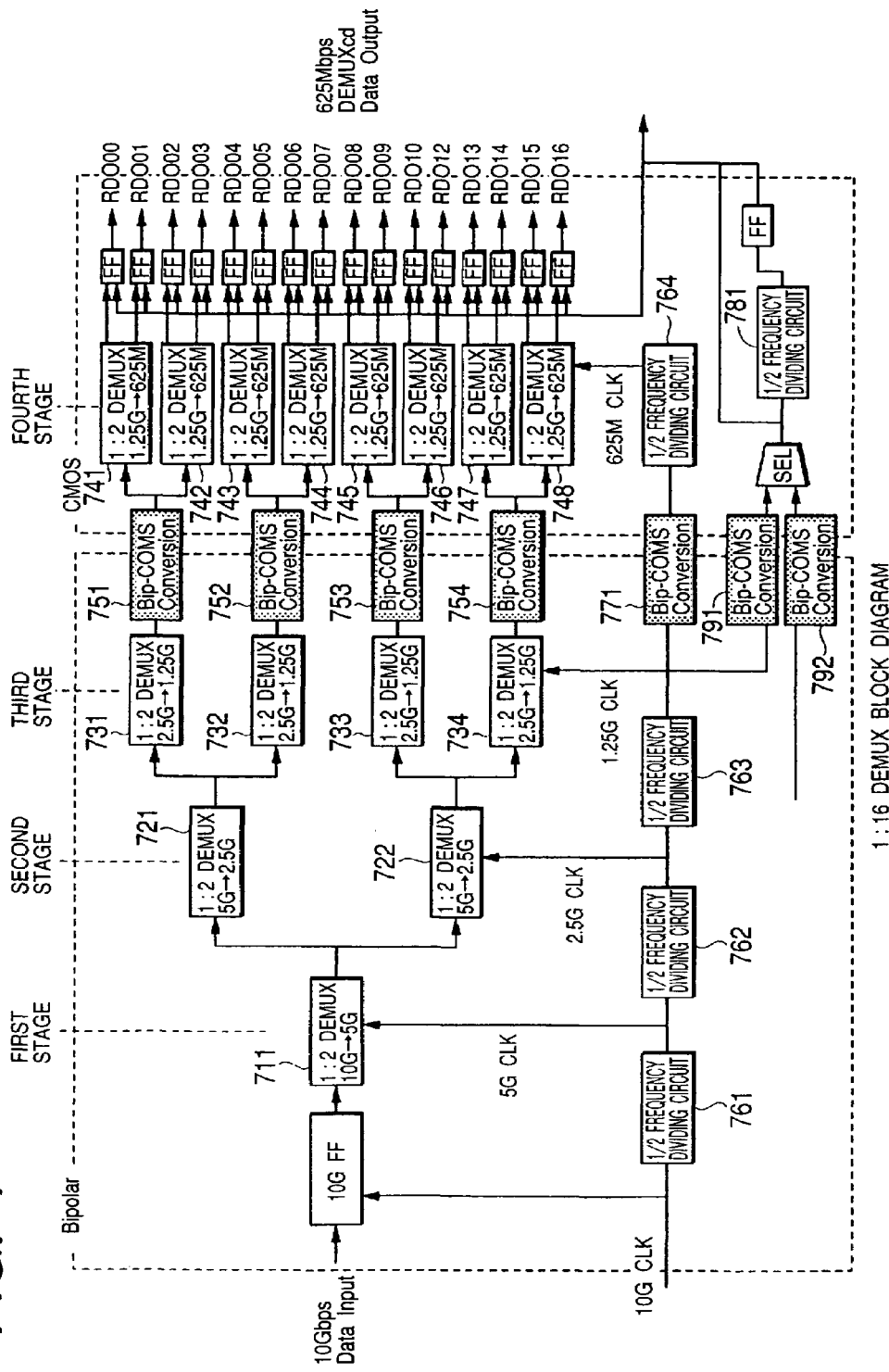
FIG. 7 is an example of the block diagram of a 1:16 DEMUX circuit of a semiconductor integrated circuit of the third embodiment of the present invention.

(3) As a practical example of the circuit illustrated in FIG. 5, a block diagram of the 1:16 DEMUX circuit is illustrated in FIG. 7.

As illustrated in the figure, four stages of the 1:2 DEMUX circuit are provided and the DEMUX circuits from the first stage to the third stage are formed of bipolar ECL circuits, while the DEMUX circuit of the fourth stage is formed of CMOS circuits.

An input signal Data Input of 10 Gbps is divided to two signals of 5 G with the 1:2DEMUX (711) of the first stage via a flip-flop circuit (10 GFF). Two signals of 5 G are further divided to four signals of 2.5 G with the 1:2DE-MUXs (721, 722) of the second stage. The four signals of 2.5 G are further divided to eight signals of 1.25 G with the 1:2DEMUXs (731 to 734) of the third stage. In this case, these signals are adjusted by the level conversion circuits (Bip.-CMOS conversion 751 to 754) in such a degree that amplitude and level of signal may be driven with the 1:2DEMUXs (741 to 748) formed of the CMOS circuit of the fourth stage.

Moreover, eight signals of 1.25 G are divided to 16 signals of 625M with the 1:2DEMUXs (741 to 748) of the fourth stage. These signals become the output signals (Data Output: RDO00 to RDO16) demultiplexed to 625 bps via the flip-flop circuit FF.

Moreover, the 1:2DEMUX circuits of the first to fourth stages are respectively controlled with the clocks (CLKs). These clocks are sequentially frequency-divided with the 1/2 frequency-dividing circuits (761 to 764) to control the 1:2DEMUX circuit of each stage. The 1/2 frequency-dividing circuits (761 to 763) among these 1/2 frequency-dividing circuits (761 to 764) which output the signals to control the 1:2DEMUX circuit formed of the bipolar ECL circuit is formed of the bipolar ECL circuit, while the 1/2 frequency-dividing circuit (764) which outputs the signal to control the 1:2DEMUX circuit formed of the CMOS circuit is formed of the CMOS circuit. Therefore, the level conversion circuit (Bip.-CMOS conversion 771) is provided in the course of the 1/2 frequency-dividing circuits (761 to 764).

That is, the flip-flop circuit (10 GFF) is controlled with the clock (CLK) of 10 G and the 1:2DEMUX (711) of the first stage is controlled with the clock of 5 G obtained by frequency division of the clock of 10 G with the 1/2 frequency-dividing circuit (761). In the same manner, the 1:2DEMUXs (721, 722) of the second stage are controlled with the clock of 2.5 G obtained by frequency division of the clock of 5 G with 1/2 frequency-dividing circuit (762) and the 1:2DEMUXs (731 to 734) of the third stage are controlled with the clock of 1.25 G obtained by frequency division of the clock of 2.5 G with the 1/2 frequency-dividing circuit (763). In addition, the 1:2DEMUXs (741 to 748) formed of the CMOS circuit of the fourth stage are controlled with the clock of 625M obtained by frequency division of the clock of 1.25 G with the 1/2 frequency-dividing circuit (764) but the clock of 1.25 G is adjusted in the amplitude and level with the level conversion circuit (Bip.-CMOS Conversion 771) in the degree to be driven with the 1/2 frequency-dividing circuit (764) formed of the CMOS circuit.

Here, power consumption of the 1:16 DEMUX circuit is 354 mW. Meanwhile, when the 1:2 DEMUX circuits of the first to fourth stages are all formed of the bipolar ECL circuits, power consumption thereof becomes 482 mW.

SEL designates a selector, 781 designates a 1/2 frequency-dividing circuit, 791 and 792 respectively designate level conversion circuit (Bip.-CMOS Conversion).

Figure 8:
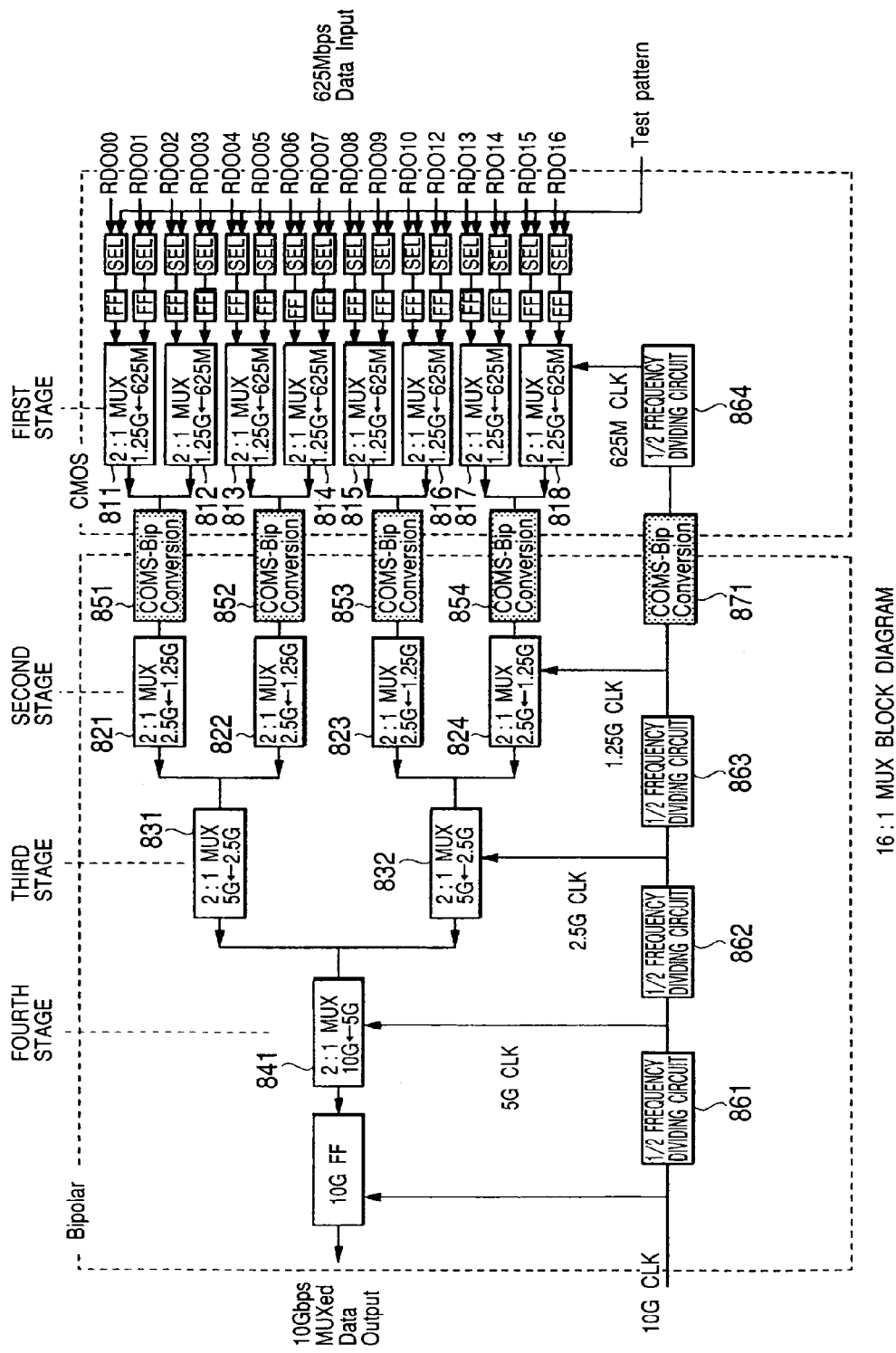
FIG. 8 is an example of the block diagram of a 16:1 MUX circuit of a semiconductor integrated circuit (device) of the third embodiment of the present invention.

(4) Next, as a practical example of the circuit of FIG. 6, a block diagram of a 16:1 MUX circuit is illustrated in FIG. 8.

As illustrated in the figure, the four stages of the 2:1 MUX circuit are provided. The MUX circuit of the first stage is formed of a CMOS circuit and the MUX circuits from the second stage to the fourth stage are formed of bipolar ECL circuits.

Sixteen input signals of 625 Mbps (Data Input: RDO00 to RDO16) are multiplexed to eight signals of 1.25 G with the 2:1 MUXs (811 to 818) of the first stage via the selector (SEL) and the flip-flop circuit (FF) These eight signals of 1.25 G are then adjusted in the amplitude and level thereof with the level conversion circuits (CMOS-Bip. Conversion, 851 to 854) to the degree to be driven with the 2:1 MUXs (821 to 824) formed of the bipolar ECL circuits of the second stage.

Moreover, eights signals of 1.25 G are then multiplexed to four signals of 2.5 G with the 2:1 MUXs (821 to 824) of the second stage. Four signals of 2.5 G are moreover multiplexed to two signals of 5 G with the 2:1 MUXs (831, 832) of the third stage. In addition, two signals of 5 G are multiplexed to one signal of 10 G with the 2:1 MUX (841) of the fourth stage. This signal becomes the output signal Data Output multiplexed to 10 Gbps via the flip-flop circuit (10 GFF).

Moreover, the MUX circuits of the first to fourth stages are respectively controlled with clocks (CLKs). These clocks are sequentially frequency-divided with the 1/2 frequency-dividing circuits (861 to 864) to control the 2:1

MUX circuit of each stage. The 1/2 frequency-dividing circuits (861 to 863) for outputting the signals to control the MUX circuit formed of the bipolar ECL circuit among these 1/2 frequency-dividing circuits (861 to 864) are formed of the bipolar ECL circuits, while the 1/2 frequency-dividing circuit (864) formed of the bipolar ECL circuit for outputting the signal to control the MUX circuit formed of the CMOS circuit is formed of the CMOS circuit. Therefore, a level conversion circuit (CMOS-Bip. Conversion 871) is provided in the course of the 1/2 frequency-dividing circuits (861 to 864).

Frequency division of clock is similar to that of the DEMUX circuit described with reference to FIG. 7 and the detail description is avoided here.

Here, power consumption of the 16:1 MUX circuit is 268 mW. Meanwhile, when the 2:1 MUXs of the first to fourth stages are all formed of the bipolar ECL circuit, power consumption thereof becomes 376 mW.

Figure 9:
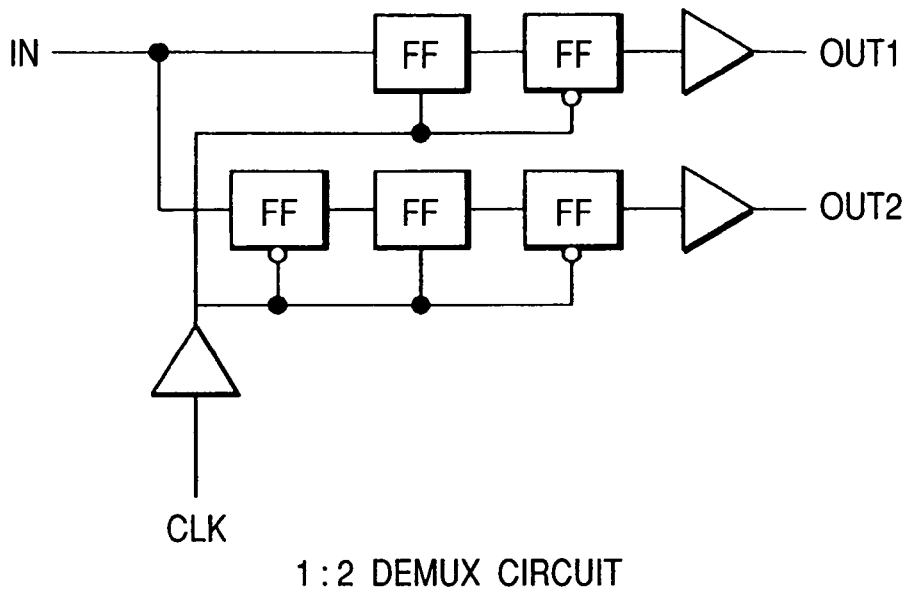
FIG. 9 is an example of the block diagram of a 1:2 DEMUX circuit of the third embodiment of the present invention.
Figure 10:
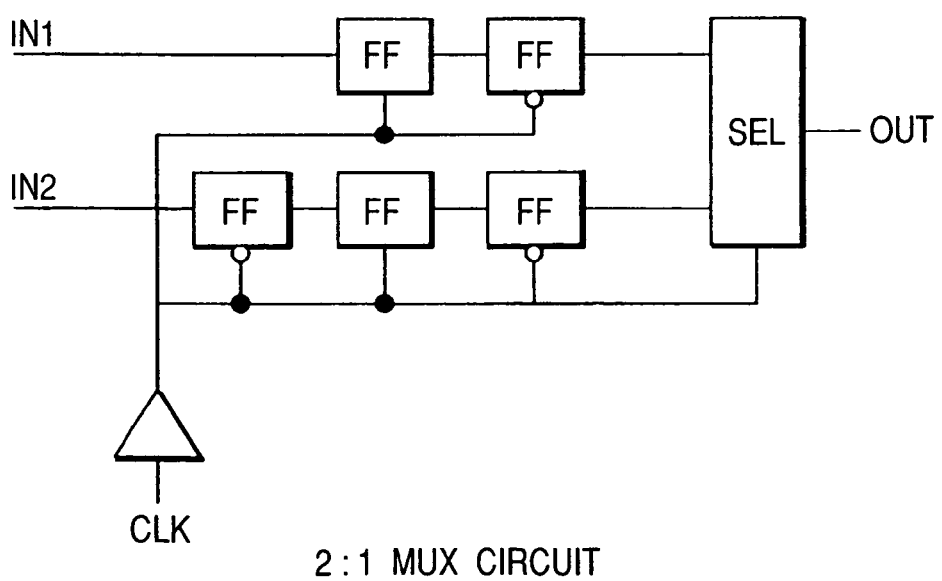
FIG. 10 is an example of a 2:1 MUX circuit forming a semiconductor integrated circuit (device) of the third embodiment of the present invention.

(5) Examples of circuit structures of the 1:2 DEMUX and 2:1 MUX are illustrated in FIG. 9 and FIG. 10.

As illustrated in FIG. 9, the 1:2 DEMUX is formed of a plurality of flip-flop circuits (FF) and an inverter. IN designates an input, while OUT1 and OUT2 designate outputs and CLK designates an input of clock signal.

Moreover, as illustrated in FIG. 10, the 2:1 MUX is formed of a plurality of flop-flop circuits (FF), inverter and selector (SEL). IN1 and IN2 designate inputs, OUT designates an output and CLK designates an input of clock signal.

Figure 11:
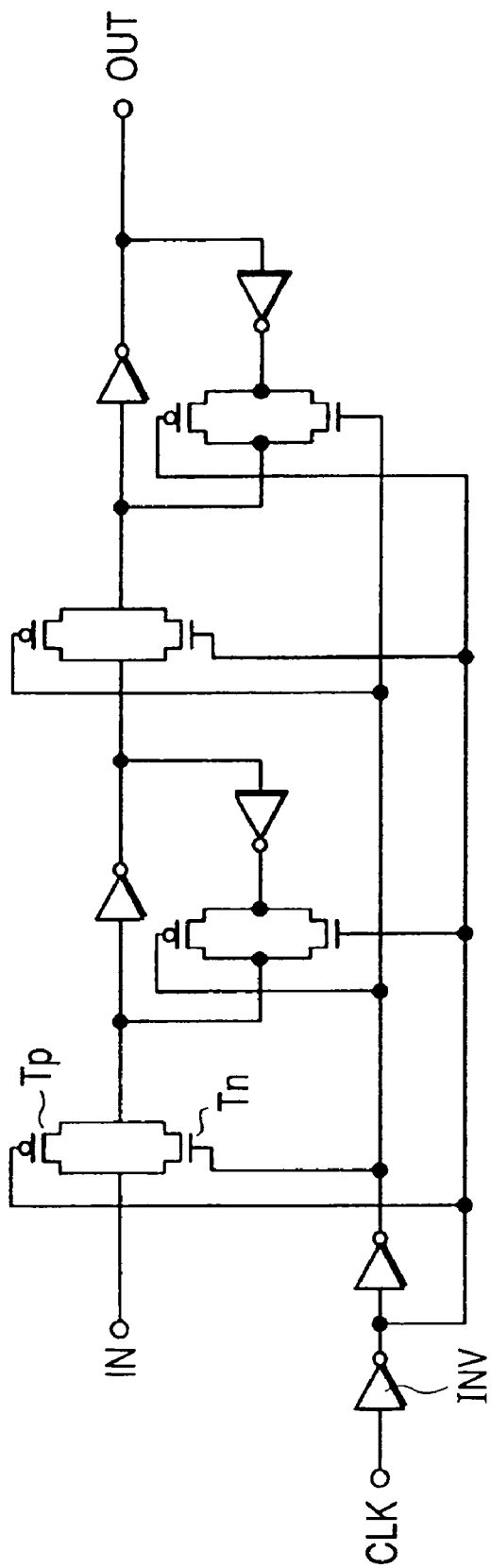
FIG. 11 is an example of a circuit diagram where a flip-flop circuit (FF) of a semiconductor integrated circuit (device) of the third embodiment of the present invention is formed of a CMOS circuit.

In addition, an example of circuit structure when the flip-flop (FF) is formed of a CMOS circuit is illustrated in FIG. 11.

As illustrated in the figure, the flip-flop may be formed of a plurality of MISFETs and CMOS inverters. IN designates an input, OUT designates an output, CLK designates a clock input. Tp in the figure designates a p-channel type MISFET, Tn designates an n-channel type MISFET and INV designates an inverter.

Figure 12:
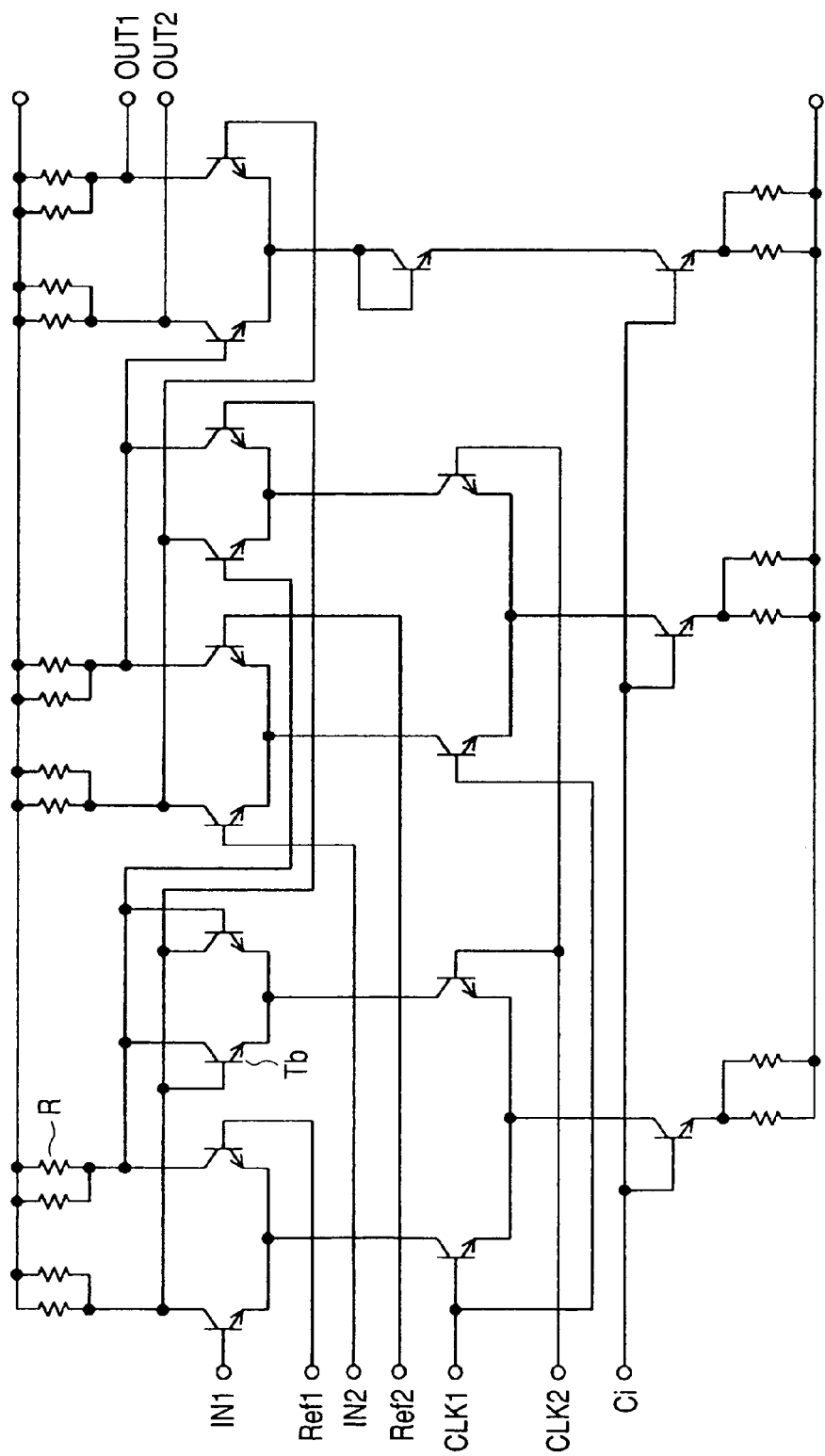
FIG. 12 is an example of a circuit diagram where a flip-flop (FF) and a selector (SEL) of a semiconductor integrated circuit (device) of the third embodiment of the present invention are formed of a bipolar ECL circuit.

Moreover, FIG. 12 illustrates an example of circuit structure when the flip-flop (FF) and selector (SEL) are formed of the bipolar ECL circuit.

As illustrated in the figure, the flip-flop and selector are formed of a plurality of bipolar transistors Tb and resistance elements R. In the circuit illustrated, emitters of the bipolar transistors are paired. This circuit is called a bipolar ECL circuit and is suitable for high speed operation. IN1 and IN2 designate inputs, OUT1 and OUT2 designate outputs, CLK1 and CLK2 designate clock inputs. Moreover, Ref1 and Ref2 designate reference signals and Ci designates a current control signal.

As described above, MUX and DEMUX may be formed of bipolar transistors or of CMOS transistors.

Figure 13:
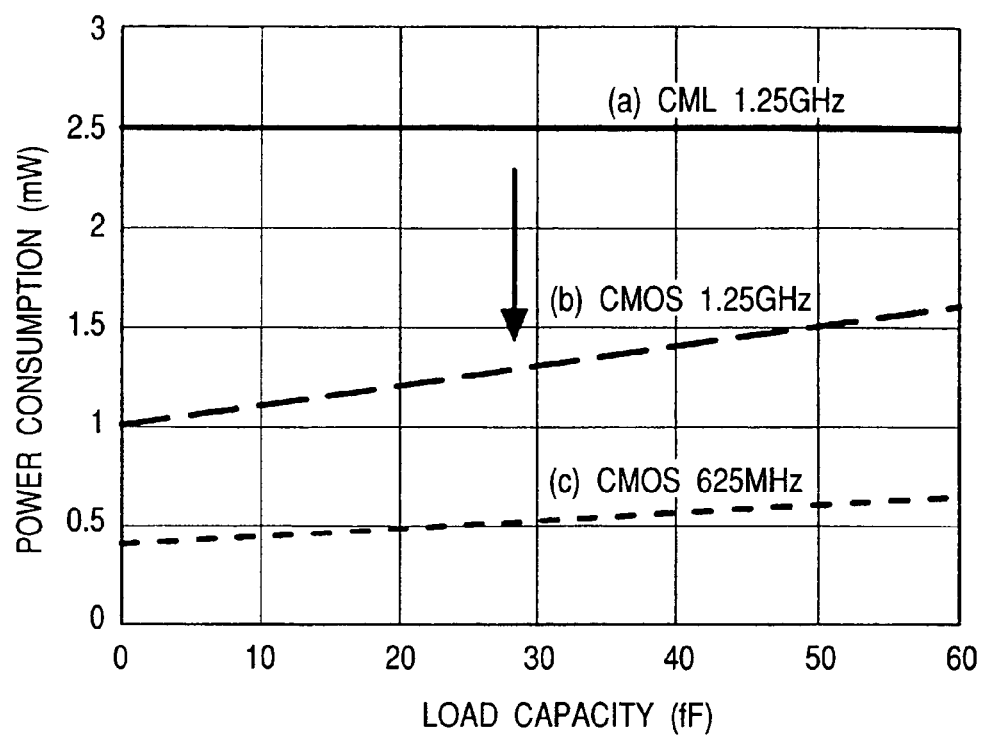
FIG. 13 is a graph showing a relationship between a load capacity and power consumption of bipolar CMLFF and CMOS inverter FF.

FIG. 13 illustrates a relationship between load capacity and power consumption of FF of the bipolar CML (Common Mode Logic) and FF of the CMOS inverter. An ordinate indicates power consumption (mW) and an abscissa indicates load capacity (fF). Power consumption when the signal of 1.25 GHz is inputted to the CMOS inverter FF of graph (b) is smaller than the power consumption when the signal of 1.25 GHz is inputted to the bipolar CML FF of graph (a). Power consumption when the signal of 625 MHz is inputted to the CMOS inverter FF of graph (c) is smaller than that when the signal of 1.25 GHz is inputted.

As described above, power consumption may be reduced by utilizing the CMOS circuit.

Figure 14:
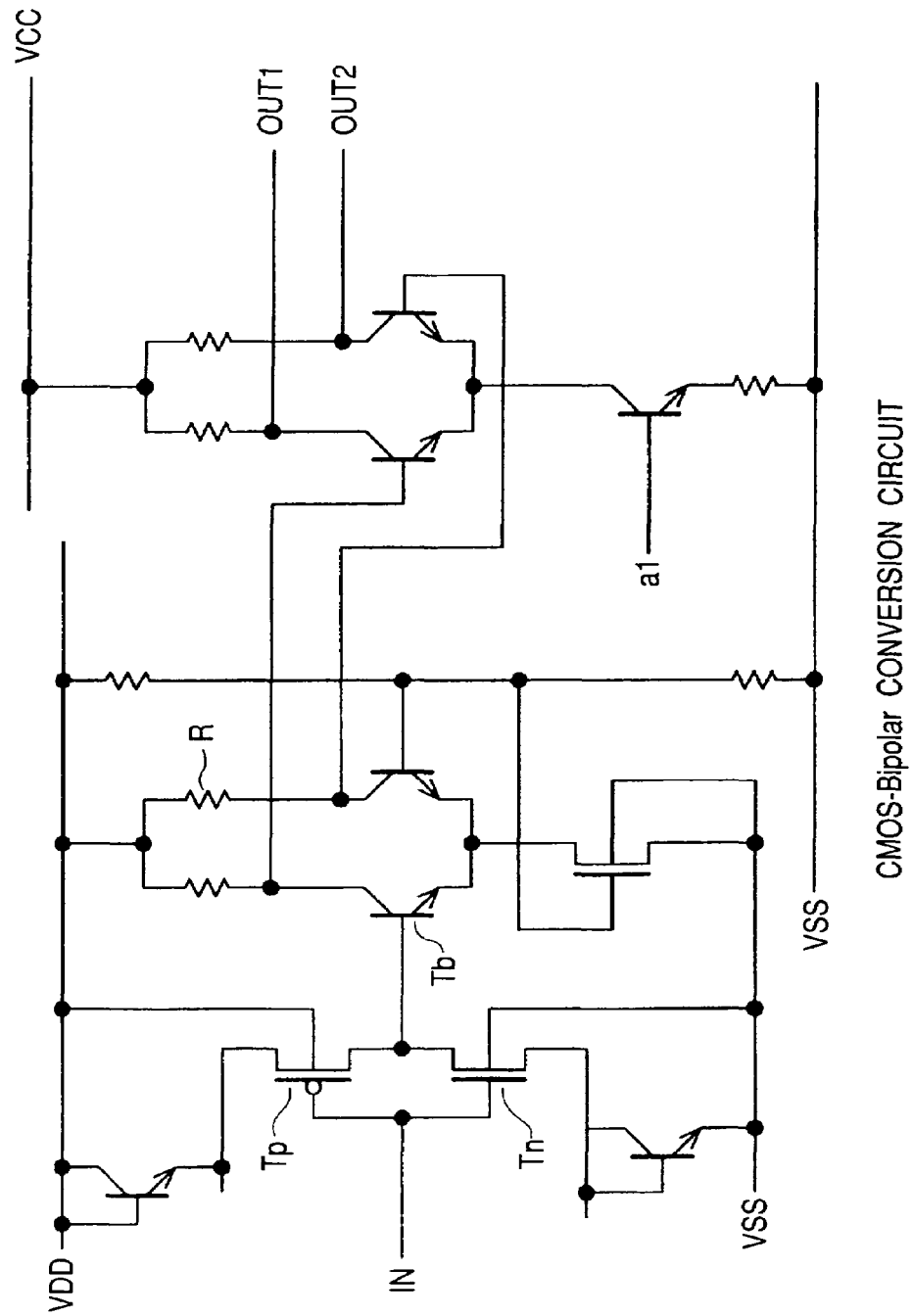
FIG. 14 is an example of a circuit diagram of a level conversion circuit of a semiconductor integrated circuit (device) of the third embodiment of the present invention.
Figure 15:
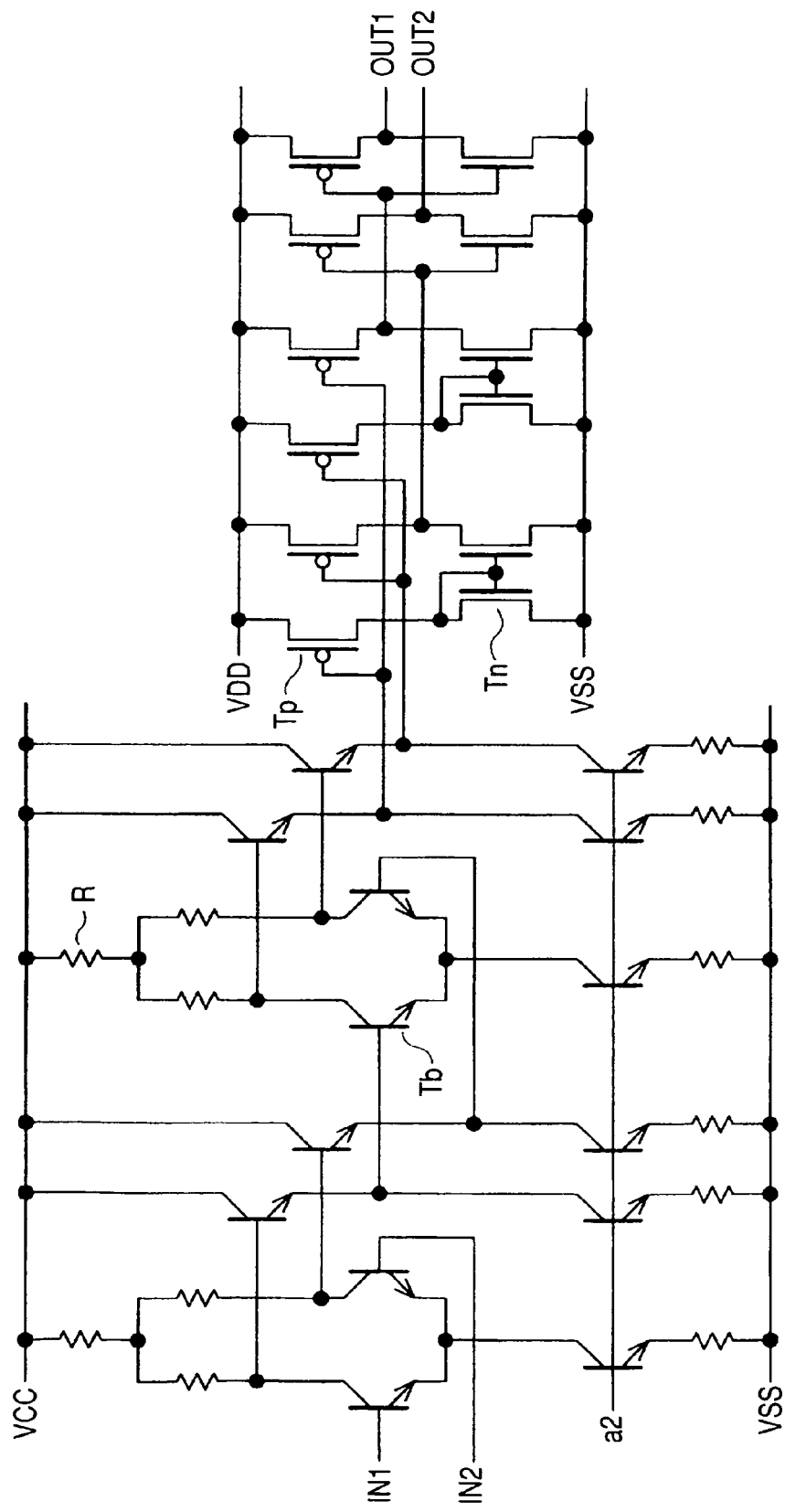
FIG. 15 is an example of a circuit diagram of a level conversion circuit of a semiconductor integrated circuit (device) of the third embodiment of the present invention.

(6) FIG. 14 and FIG. 15 illustrate examples of circuit structures of the level conversion circuits.

FIG. 14 illustrates a level conversion circuit to convert a signal for the CMOS circuit to a signal for the bipolar ECL circuit. As illustrated in the figure, this circuit is formed of a plurality of MISFETs (Tp, Tn), bipolar transistors Tb and resistance elements R. As described with reference to FIG. 16, amplitude and level of the signal are converted for the bipolar ECL circuit. Here, amplitude between the VDD (first power source potential) and VSS (reference potential) is changed to the amplitude determined with voltage drop of the resistor.

FIG. 15 illustrates a level conversion circuit for converting a signal for bipolar ECL circuit to a signal for CMOS circuit. As illustrated in this figure, this circuit is formed of a plurality of MISFETs (Tp, Tn), bipolar transistors Tb and resistance elements R. As described with reference to FIG. 16, amplitude and level of the signal are converted for the CMOS circuit. Here, amplitude between the VDD (second power source potential) and VSS (reference potential) is changed to the amplitude determined with voltage drop of the resistor.

IN1 and IN2 designate inputs, OUT1 and OUT2 designate outputs and a1 and a2 designate control signal inputs.

Figure 17:
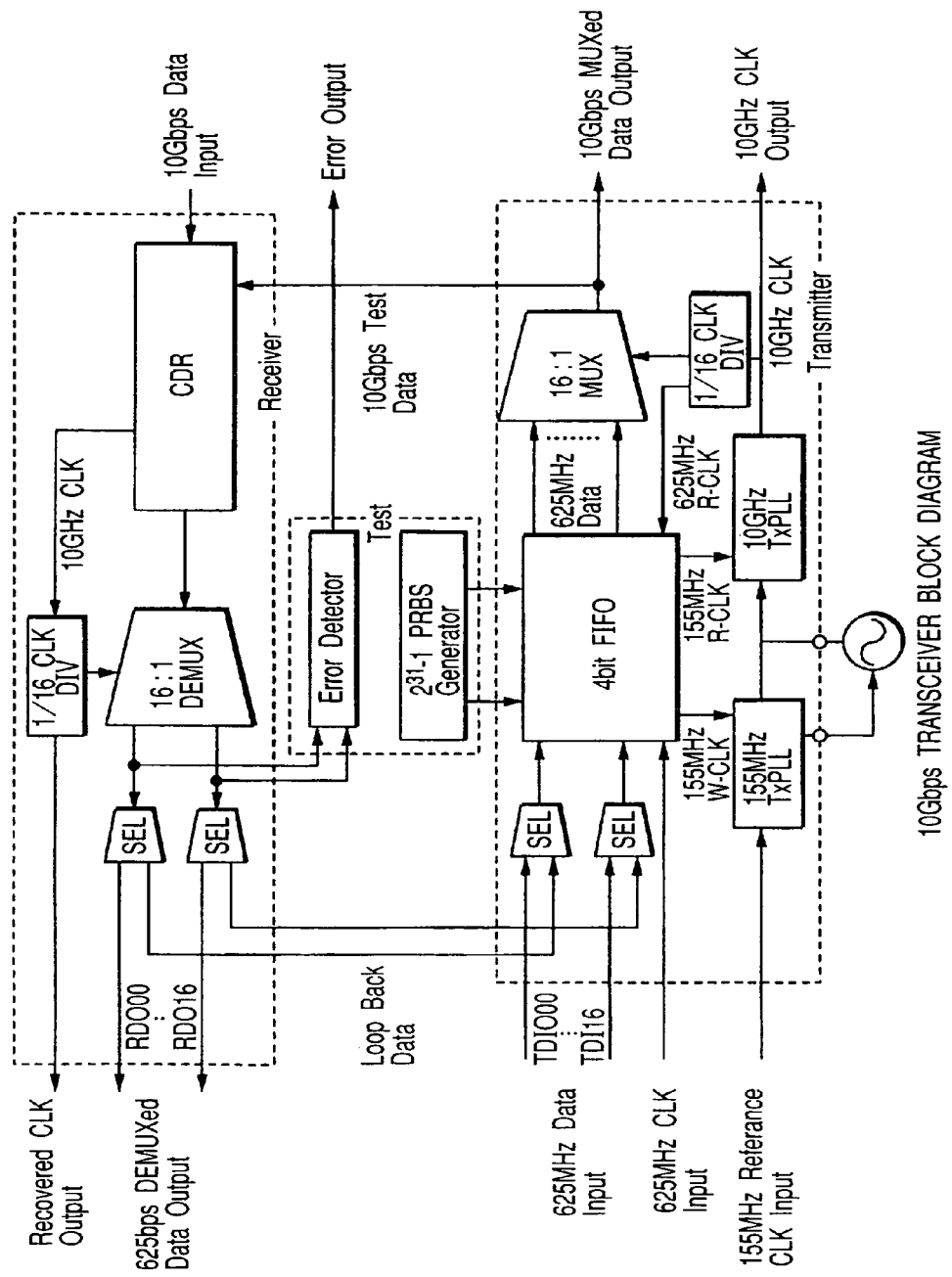
FIG. 17 is an example of a block diagram of a transceiver LSI of a semiconductor integrated circuit (device) of the third embodiment of the present invention.

(7) The 1:16 DEMUX circuit and 16:1 MUX circuit described with reference to FIG. 7 and FIG. 8 are used, for example, in a transceiver LSI (Transceiver Large Scale Integrated Circuit). FIG. 17 illustrates a block diagram thereof.

As illustrated in this figure, the input signal (Data Input) of 10 Gbps is inputted to the 16:1 DEMUX circuit via a clock data recovery (CDR) of a receiver. This 16:1 DEMUX circuit outputs the signals demultiplexed to 625 Mbps (Data Output: RDO00 to RDO16) via the selector (SEL). The clock data recovery (CDR) is a circuit for synchronizing the input signal (Data Input) to the clock.

Moreover, in the 16:1 DEMUX circuit, the signal frequency-driven with the 1/16 clock frequency divider (1/16 CLKDIV) is inputted, and the 16:1 DEMUX circuit is controlled with this signal.

In addition, in the transmitter, a plurality of input signals of 625 MHz (Data Input: TDI00 to TDI16) are inputted to the FIFO (First In First Out) of 4-bit via the selector (SEL). With this FIFO, the input signals are synchronized with the clock and is then inputted to the 16:1 MUX circuit. This 16:1 MUX circuit outputs the signal (Data Output) multiplexed to 10 Gbps.

Moreover, the 16:1 MUX circuit receives the signal frequency-driven with the 1/16 clock frequency divider (1/16 CLK DIV) and is then controlled with this signal.

The 155 MHz TxPLL controls the signal of external oscillator of 10 GHz with the reference of 155 MHz and Write clock of FIFO. Moreover, the clock of 10 GHz is controlled in the 10 GHz TxPLL with the Read clock signal of FIFO to generate the clock of 10 GHz in the IC.

In addition, an Error Detector checks whether there is an error in the data after the DEMUX circuit. A PRBS generator is a random number generator to generate the data for self-testing the IC.

Figure 18:
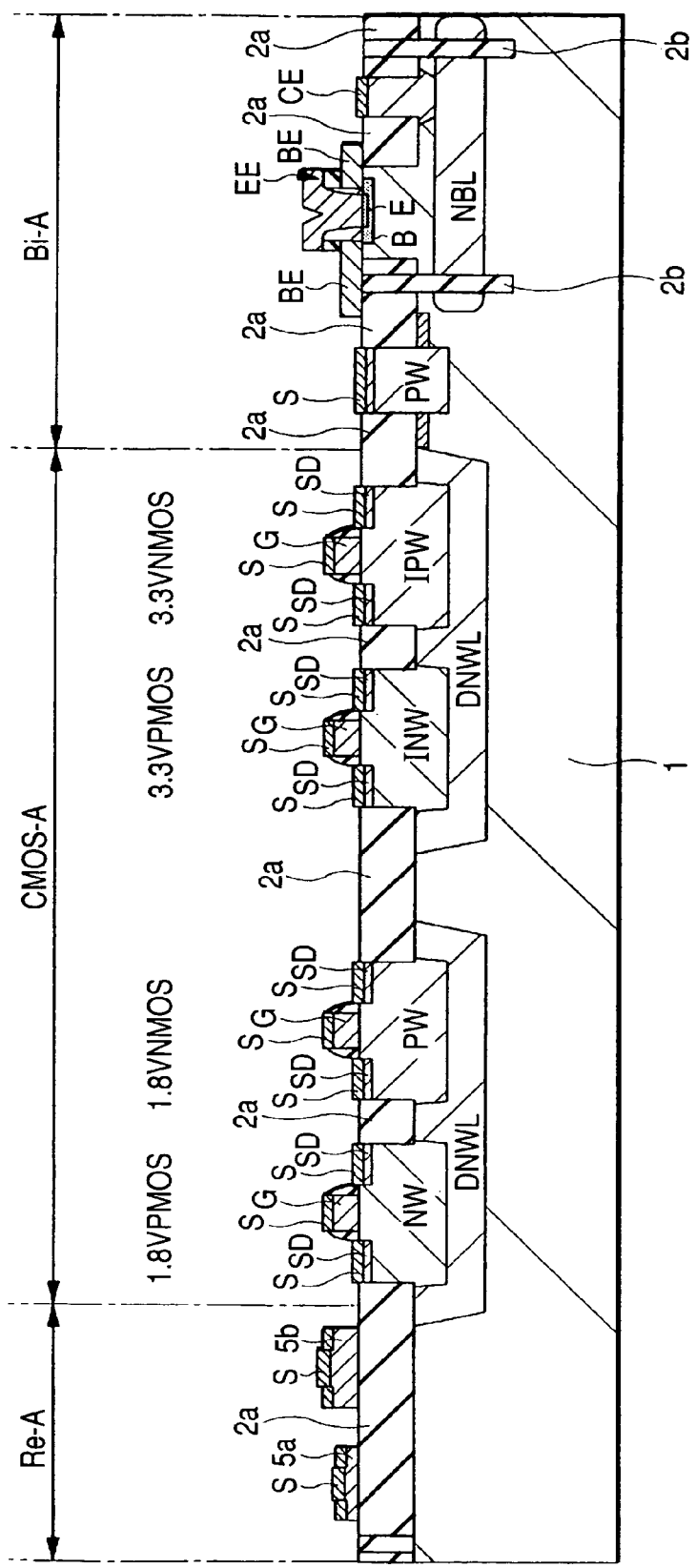
FIG. 18 is a cross-sectional view of an essential portion of a substrate illustrating an example of the structure of bipolar transistor and MISFET or the like forming a semiconductor integrated circuit (device) of the third embodiment of the present invention.

(8) An example of the structures of bipolar transistor and MISFET forming the circuit of the present invention, namely the structure of Bi-CMOS device will be described. FIG. 18 is a cross-sectional view of a device. The CMOS-A indicates a CMOS forming region, while Bi-A indicates a bipolar transistor forming region. The region between these regions is adequately isolated with element isolations 2a and 2b comprised of an insulation film. Moreover, Re-A is a resistance element forming region. In addition, FIG. 19 is an enlarged view of the bipolar transistor forming region (Bi-A) of FIG. 18.

Figure 19:
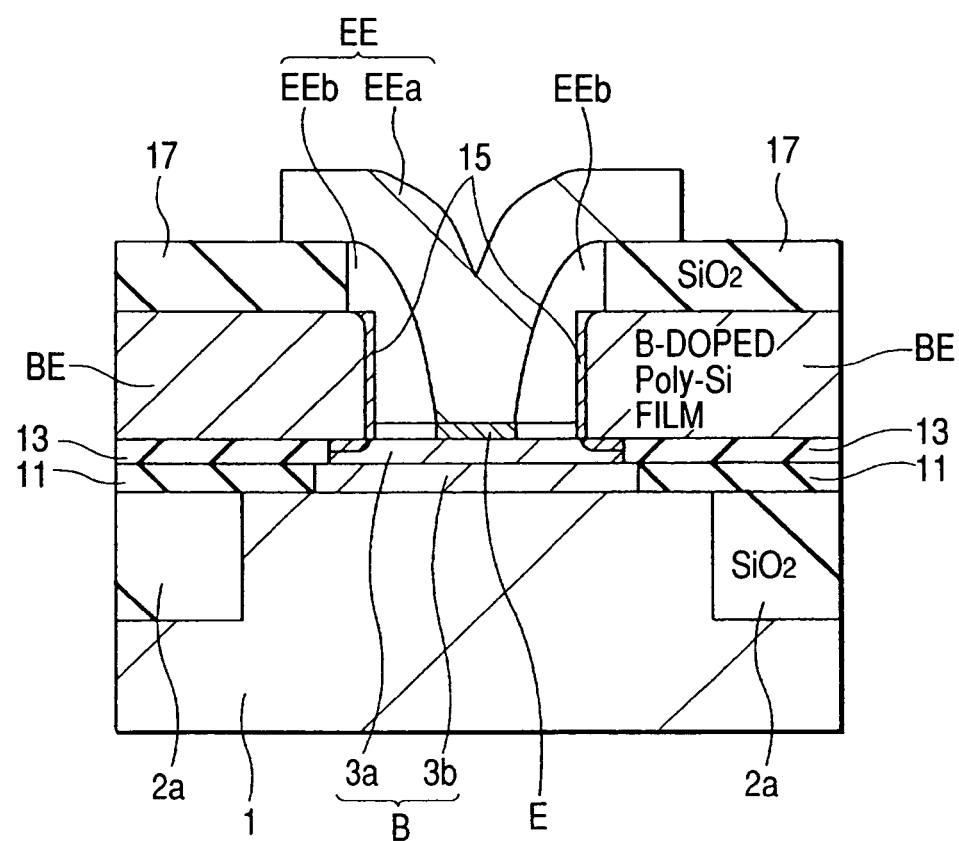
FIG. 19 is a cross-sectional view of an essential portion of a substrate illustrating an example of the structure of bipolar transistor forming a semiconductor integrated circuit (device) of the present invention.

As illustrated in FIG. 18 and FIG. 19, an n-type semiconductor region NBL is formed in the bipolar transistor forming region (Bi-A) of the p-type semiconductor substrate (silicon substrate) 1, a base region B is formed on the main surface thereof and an emitter region E is formed thereon. This base region B is formed of a p-type SiGe (silicon germanium) 3a of about 15 nm and an i-type SiGe (silicon germanium) 3b not including impurity of about 35 nm. On both ends of base region B, the base electrode BE is formed and the emitter EE is formed on the emitter region E. This emitter electrode is composed of the region EEb not including impurity and the region EEa including impurity. Moreover, the emitter electrode EE and base electrode BE are insulated with an insulation film 15. Reference numerals 11, 13, and 17 designate insulation films. Moreover, at the end part of base region B, impurity in the base electrode BE is diffused. In addition, the n-type semiconductor region NBL is provided to lower a collector resistance and is electrically connected to a collector electrode CE.

It is of course possible to form the base region of the bipolar ECL circuit described in the embodiments 1 and 2 using silicon Si.

Figure 20:
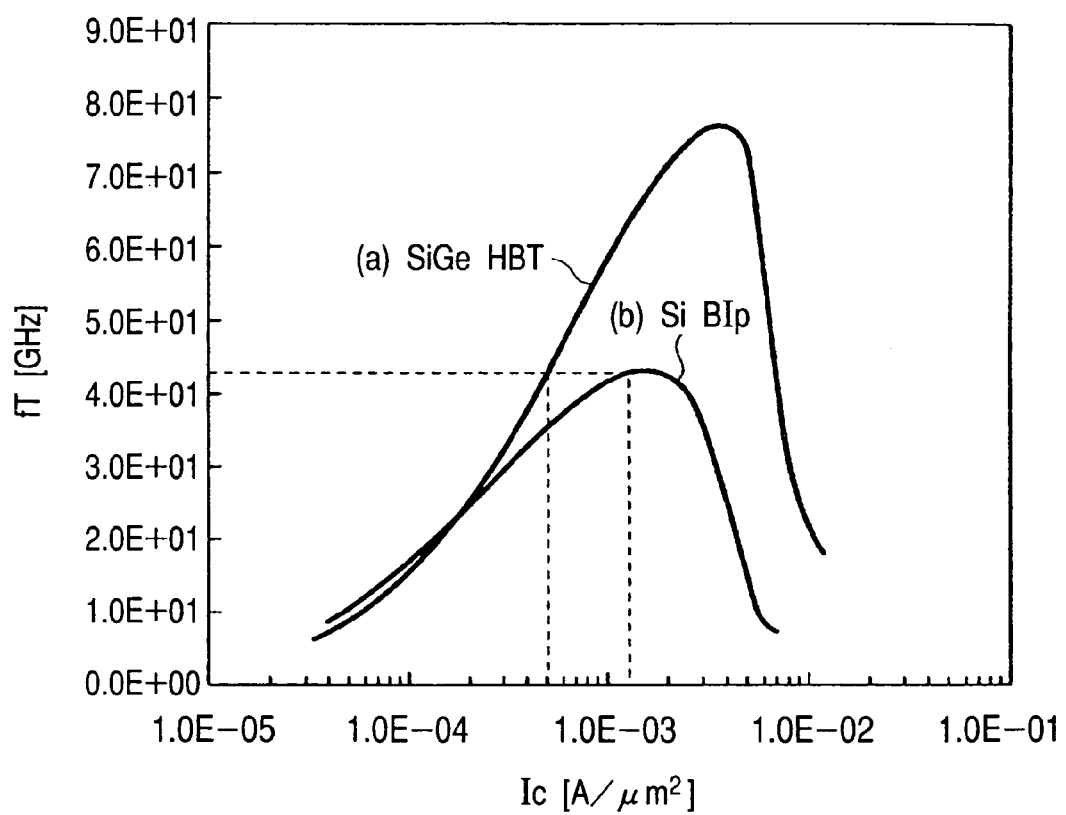
FIG. 20 is a graph showing a relationship between the maximum cut-off frequency Tf and current Ic per unit region when a SiGe is used and Si is used for the base region.

However, as illustrated in FIG. 20, when SiGe is used for the base region, higher fT (maximum cut-off frequency) can be obtained with a lower current. Accordingly, when SiGe is used, the signal of higher frequency which is higher than 70 GHz or more can be processed. The vertical axis in FIG. 20 indicates fT (GHz) and the horizontal axis indicates a current Ic (A/$\mu m^2$) per unit area. For example, "1.0E-05" indicates $1.0 \times 10^{-5}$. The graph (a) corresponds to the case where SiGe is used, while the graph (b) corresponds to the case where only Si is used.

Therefore, when SiGe is used, characteristic difference for the CMOS circuit becomes large and therefore SiGe may be used suitably for this embodiment.

Particularly, when the frequency to be processed with the bipolar ECL circuit is two times or higher than the frequency to be processed with the CMOS circuit, this embodiment can be used more effectively.

In addition, an NMOS (n-channel type MISFET) and a PMOS (p-channel type MISFET) which are driven with 3.3V are formed in the CMOS forming region CMOS-A of the p-type semiconductor substrate 1. Moreover, an NMOS and a PMOS which are driven with 1.8V are also formed. These MOS transistors are formed on the deep n-type semiconductor region DNWL, PMOS is formed on the n-type well (NW, INW), while NMOS is formed on the p-type well (PW, IPW). These MOS transistors include a gate electrode G comprised of polycrystalline silicon film and source and drain regions SD formed in the semiconductor substrate in both sides of the gate electrode G. Moreover, a silicide film S is formed on the gate electrode G, and source and drain regions SD.

In addition, in the resistance element forming region (Re-A), for example, conductive films (5a, 5b) comprised of polycrystalline silicon film formed on the element isolation 2a and the silicide film S at the upper part thereof are formed. Although not illustrated, it is also possible to form a resistance element using impurity region in the semiconductor substrate.

As described above, the circuits illustrated in FIG. 11 and FIG. 12, DEMUX circuit (FIG. 7) and MUX circuit (FIG. 8) or the like may be formed through combination of elements illustrated in FIG. 18.

As described above, the embodiments 1 to 3 requires, as the high-speed optical communication and high-speed tester of 40 Gbps and 10 Gbps, high-speed data process, signal frequency dividing function and multiplexing/demultiplexing of data and can therefore be effectively introduced into an IC allowing co-existence of bipolar transistor and MISFET.

The present invention has been described more practically based on the preferred embodiments thereof but the present invention is never limited thereto and allows various changes and modifications within the scope not departing from the claims thereof.

For example, the single stage of 1:2 DEMUX or 2:1 MUX circuit comprised of CMOS circuit has been provided in FIG. 7 and FIG. 8, but a plurality of stages may also be used. Moreover, for example, in FIG. 7 and FIG. 8, the limit of frequency of the signal to be processed by the CMOS circuit is set to 1.25 GHz but the signal of higher frequency can be processed with the CMOS circuit by improving the characteristics of CMOS circuit.

The effects obtained by the typical inventions of the present invention may be described as follows.

The circuit having the function to reduce or increase frequency is formed of a first circuit consisting of bipolar device and a second circuit consisting of MISFET device. Only the frequency which cannot be processed only with the first circuit comprised of bipolar device is processed with the first circuit and the frequency which can be processed with the second circuit comprised of MISFET is processed with the second circuit. Accordingly, power consumption of the circuit can be realized. Moreover, the characteristics of the circuit can also be improved such as improvement in the processing speed of the circuit.

What is claimed is:

1. A semiconductor integrated circuit device, comprising:
    (a) a bipolar ECL circuit including a bipolar device, said bipolar ECL circuit receiving a first signal of a first frequency and outputting a second signal of a second frequency which is lower than said first frequency;
    (b) a level conversion circuit for converting signal level and amplitude, said level conversion circuit receiving said second signal and outputting a third signal of said second frequency in response to said second signal; and
    (c) a CMOS circuit including a MISFET device, said CMOS circuit receiving said third signal and outputting a fourth signal of a third frequency which is lower than said second frequency.

2. A semiconductor integrated circuit device according to claim 1,
    (a) wherein said second frequency is $1/2^n$ (n: positive integer) times said first frequency and said bipolar ECL circuit outputs $2^n$ of said second signals, and
    (b) wherein said third frequency is $1/2^m$ (m: positive integer) times said second frequency and said CMOS circuit outputs $2^m$ of said fourth signals.

3. A semiconductor integrated circuit device according to claim 1, further comprising:
    (a) a frequency divider for multiplying the signal frequency to $1/2^k$ (k: positive integer) times, said frequency divider receiving a first control signal and outputting a second control signal of the frequency of $1/2^k$ times said first control signal,
    (b) wherein said first control signal is inputted to said bipolar ECL circuit and said second control signal is inputted to said CMOS circuit.

4. A semiconductor integrated circuit device according to claim 1,
wherein said bipolar device has a base region comprised of $Si_{1-x}Ge_x$.

5. A semiconductor integrated circuit device according to claim 1,
wherein said bipolar device has a base region comprised of $Si_{1-x}Ge_x$,
wherein said bipolar device has a maximum cut-off frequency of 70 GHz or higher, and
wherein a maximum frequency of the signal to be processed with said bipolar ECL circuit is two or more times a maximum frequency of the signal to be processed with said CMOS circuit.

6. A semiconductor integrated circuit device, comprising:
(a) a CMOS circuit including a MISFET device, said CMOS circuit receiving a first signal of a first frequency and outputting a second signal of a second frequency which is higher than said first frequency;
(b) a level conversion circuit for converting signal level and amplitude, said level conversion circuit receiving said second signal and outputting a third signal of said second frequency in response to said second signal; and
(c) a bipolar ECL circuit including a bipolar device, said bipolar ECL circuit receiving said third signal and outputting a fourth signal of a third frequency which is higher than said second frequency.

7. A semiconductor integrated circuit device according to claim 6,
(a) wherein said second frequency is $2^m$ (m: positive integer) times said first frequency and said CMOS circuit outputs $1/2^m$ multiplexed second signals, and
(b) wherein said third frequency is $2^n$ (n: positive integer) times said second frequency and said bipolar ECL circuit outputs $1/2^n$ multiplexed fourth signals.

8. A semiconductor integrated circuit device according to claim 6, further comprising:
(a) a frequency divider for multiplying signal frequency to $1/2^k$ (k: positive integer) times, said frequency divider receiving a first control signal and outputting a second control signal of a frequency of $1/2^k$ times a frequency of said first control signal,
(b) wherein said first control signal is inputted to said bipolar ECL circuit and said second control signal is inputted to said CMOS circuit.

9. A semiconductor integrated circuit device according to claim 6,
wherein said bipolar device has a base region comprised of $Si_{1-x}Ge_x$.

10. A semiconductor integrated circuit device according to claim 6,
wherein said bipolar device has a base region comprised of $Si_{1-x}Ge_x$,
wherein said bipolar device has a maximum cut-off frequency of 70 GHz or higher, and
wherein a maximum frequency to be processed with said bipolar ECL circuit is two or more times a maximum frequency of the signal to be processed with said CMOS circuit.

11. A semiconductor integrated circuit device comprising (m+n) stages (in, n: positive integer) of circuits which output two signals of a frequency divided to 1/2 from a frequency of an input signal,
(a) wherein said circuits up to the first mth stage among said (m+n) stages are formed with bipolar devices,
(b) wherein the remaining n stages of said circuits among said (m+n) stages are formed with MISFET devices, and
(c) wherein a level conversion circuit for converting signal level and amplitude is provided between the circuit of the mth stage and the circuit of the (m+1)th stage.

12. A semiconductor integrated circuit device according to claim 11, further comprising:
a frequency divider for multiplying signal frequency to $1/2^n$ (k: positive integer) times, said frequency divider receiving a first control signal and outputting a second control signal of the frequency of $1/2^k$ times the frequency of said first control signal,
(a) wherein said first stage circuit is controlled with the signal of the frequency of 1/2 times said first control signal, and
(b) wherein said circuit of the (m+1)th stage is controlled with the signal of the frequency of $1/2^{(m+1)}$ times said first control signal.

13. A semiconductor integrated circuit device according to claim 11,
wherein said bipolar device has a base region comprised of $Si_{1-x}Ge_x$ and has a maximum cut-off frequency of 70 GHz or higher.

14. A semiconductor integrated circuit device according to claim 11,
wherein said bipolar device has a base region comprised of $Si_{1-x}Ge_x$, and
wherein a frequency of a signal inputted to said first stage circuit is two or more times that of a signal inputted to said circuit of the (m+1)th stage.

15. A semiconductor integrated circuit device comprising (n+m) stages (n, m: positive integer) of circuits for outputting a signal of a frequency of two times a frequency of two input signals,
(a) wherein said circuits up to first nth stage among said (n+m) stages are formed with MISFET devices,
(b) wherein said circuits of remaining m stages among said (n+m) stages are formed with bipolar devices, and
(c) wherein a level conversion circuit for converting signal level and amplitude is provided between said circuit of the nth stage and the circuit of the (n+1)th stage.

16. A semiconductor integrated circuit device according to claim 15, further comprising a frequency divider for multiplying signal frequency to $1/2^k$ (k: positive integer) times, said frequency divider receiving a first control signal and outputting a second control signal of a frequency of $1/2^k$ times the frequency of said first control signal, (a) wherein said circuit of the nth stage is controlled with a signal of the frequency of $1/2^{(m+1)}$ times the frequency of said first control signal, and
(b) wherein said circuit of the (n+m)th stage is controlled with the signal of the frequency of 1/2 times the frequency of said first control signal.

17. A semiconductor integrated circuit device according to claim 15,
wherein each said bipolar device has a base region comprised of $Si_{1-x}Ge_x$, and has a maximum cut-off frequency of 70 GHz or higher.

18. A semiconductor integrated circuit device according to claim 15,
wherein each said bipolar device has the base region comprised of $Si_{1-x}Ge_x$, and
wherein a frequency of a signal outputted from said circuit of the nth stage is 1/2 or less the frequency of a signal outputted from said circuit of the (m+n)th stage.

* * * * *